United States Patent
Tang et al.

(10) Patent No.: US 8,802,520 B2
(45) Date of Patent: *Aug. 12, 2014

(54) METHOD OF FORMING A FIELD EFFECT TRANSISTOR HAVING SOURCE/DRAIN MATERIAL OVER INSULATIVE MATERIAL

(71) Applicant: Micron Technology, Inc., Boise, ID (US)

(72) Inventors: Sanh D. Tang, Boise, ID (US); Michael P. Violette, Boise, ID (US); Robert Burke, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/861,082

(22) Filed: Apr. 11, 2013

(65) Prior Publication Data
US 2013/0230959 A1  Sep. 5, 2013

Related U.S. Application Data

(60) Continuation of application No. 12/191,119, filed on Aug. 13, 2008, now Pat. No. 8,440,515, which is a division of application No. 11/000,809, filed on Nov. 30, 2004, now Pat. No. 7,465,616, which is a division of application No. 10/222,326, filed on Aug. 15, 2002, now Pat. No. 7,071,043.

(51) Int. Cl.
*H01L 21/00* (2006.01)

(52) U.S. Cl.
USPC .......................... 438/197; 438/296; 438/643

(58) Field of Classification Search
USPC .......................... 438/197, 296, 643
See application file for complete search history.

(56) References Cited

U.S. PATENT DOCUMENTS

| | | |
|---|---|---|
| 4,523,213 A | 6/1985 | Konaka et al. |
| 4,530,149 A | 7/1985 | Jastrzebski et al. |
| 4,829,018 A | 5/1989 | Wahlstrom |
| 5,013,680 A | 5/1991 | Lowrey et al. |
| 5,122,848 A | 6/1992 | Lee et al. |
| 5,308,782 A | 5/1994 | Mazure et al. |
| 5,312,782 A | 5/1994 | Miyazawa |
| 5,340,754 A | 8/1994 | Witek et al. |
| 5,512,517 A | 4/1996 | Bryant |

(Continued)

FOREIGN PATENT DOCUMENTS

JP  401028876  1/1989

OTHER PUBLICATIONS

Wolf et al., "Ion Implantation for VLSI", Silicon Processing for the VLSI Era, vol. 1, Second Edition, 2000, pp. 421-423.

(Continued)

*Primary Examiner* — Laura Menz
(74) *Attorney, Agent, or Firm* — Wells St. John, P.S.

(57) ABSTRACT

In one implementation, a method of forming a field effect transistor includes etching an opening into source/drain area of a semiconductor substrate. The opening has a base comprising semiconductive material. After the etching, insulative material is formed within the opening over the semiconductive material base. The insulative material less than completely fills the opening and has a substantially uniform thickness across the opening. Semiconductive source/drain material is formed within the opening over the insulative material within the opening. A transistor gate is provided operatively proximate the semiconductive source/drain material. Other aspects and implementations are contemplated.

25 Claims, 7 Drawing Sheets

(56) References Cited

U.S. PATENT DOCUMENTS

| | | | |
|---|---|---|---|
| 5,627,097 A | 5/1997 | Venkatesan et al. | |
| 5,674,760 A | 10/1997 | Hong | |
| 5,712,173 A | 1/1998 | Liu et al. | |
| 5,736,435 A * | 4/1998 | Venkatesan et al. | 438/151 |
| 5,760,442 A | 6/1998 | Shigyo et al. | |
| 5,793,082 A | 8/1998 | Bryant | |
| 5,846,862 A | 12/1998 | May et al. | |
| 5,856,225 A | 1/1999 | Lee et al. | |
| 5,866,459 A | 2/1999 | Naem et al. | |
| 5,908,313 A | 6/1999 | Chau et al. | |
| 5,909,618 A * | 6/1999 | Forbes et al. | 438/242 |
| 5,918,134 A | 6/1999 | Gardner et al. | |
| 5,943,575 A | 8/1999 | Chung | |
| 5,963,469 A | 10/1999 | Forbes | |
| 5,972,758 A | 10/1999 | Liang | |
| 5,977,579 A | 11/1999 | Noble | |
| 5,990,536 A | 11/1999 | Lau et al. | |
| 6,027,975 A | 2/2000 | Hergenrother et al. | |
| 6,040,212 A | 3/2000 | Kim | |
| 6,040,249 A | 3/2000 | Holloway | |
| 6,054,355 A | 4/2000 | Inumiya et al. | |
| 6,060,749 A | 5/2000 | Wu | |
| 6,072,209 A * | 6/2000 | Noble et al. | 257/296 |
| 6,091,117 A | 7/2000 | Shiozawa et al. | |
| 6,150,687 A * | 11/2000 | Noble et al. | 257/302 |
| 6,156,589 A | 12/2000 | Noble | |
| 6,174,754 B1 | 1/2001 | Lee et al. | |
| 6,180,494 B1 | 1/2001 | Manning | |
| 6,191,470 B1 | 2/2001 | Forbes et al. | |
| 6,200,836 B1 | 3/2001 | Yoo | |
| 6,204,138 B1 | 3/2001 | Krishnan et al. | |
| 6,229,187 B1 | 5/2001 | Ju | |
| 6,245,636 B1 | 6/2001 | Maszara | |
| 6,261,878 B1 | 7/2001 | Doyle et al. | |
| 6,274,913 B1 | 8/2001 | Brigham et al. | |
| 6,278,161 B1 | 8/2001 | Back et al. | |
| 6,281,082 B1 * | 8/2001 | Chen et al. | 438/296 |
| 6,300,199 B1 | 10/2001 | Reinberg | |
| 6,300,219 B1 | 10/2001 | Doan et al. | |
| 6,323,524 B1 | 11/2001 | May et al. | |
| 6,358,798 B1 | 3/2002 | Chen | |
| 6,372,562 B1 | 4/2002 | Matsumoto | |
| 6,372,583 B1 | 4/2002 | Tyagi | |
| 6,372,615 B2 | 4/2002 | Back et al. | |
| 6,376,286 B1 | 4/2002 | Ju | |
| 6,388,294 B1 | 5/2002 | Radens et al. | |
| 6,391,726 B1 | 5/2002 | Manning | |
| 6,420,767 B1 | 7/2002 | Krishnan et al. | |
| 6,424,011 B1 | 7/2002 | Assaderaghi et al. | |
| 6,429,124 B1 * | 8/2002 | Tang et al. | 438/643 |
| 6,465,852 B1 | 10/2002 | Ju | |
| 6,479,866 B1 | 11/2002 | Xiang | |
| 6,498,062 B2 | 12/2002 | Durcan et al. | |
| 6,514,809 B1 | 2/2003 | Xiang | |
| 6,544,874 B2 | 4/2003 | Mandelman et al. | |
| 6,573,136 B1 | 6/2003 | Hummler | |
| 6,599,789 B1 | 7/2003 | Abbott et al. | |
| 6,617,202 B2 | 9/2003 | Lee | |
| 6,624,032 B2 | 9/2003 | Alavi et al. | |
| 6,649,460 B2 | 11/2003 | Leobandung | |
| 6,696,746 B1 | 2/2004 | Farrar et al. | |
| 6,716,687 B2 | 4/2004 | Wang | |
| 6,762,447 B1 | 7/2004 | Mandelman et al. | |
| 6,780,691 B2 * | 8/2004 | Cha et al. | 438/161 |
| 6,828,630 B2 * | 12/2004 | Park et al. | 257/339 |
| 6,844,591 B1 | 1/2005 | Tran | |
| 6,849,893 B2 | 2/2005 | Sommer | |
| 6,891,228 B2 * | 5/2005 | Park et al. | 257/346 |
| 6,936,507 B2 * | 8/2005 | Tang et al. | 438/197 |
| 6,977,413 B2 | 12/2005 | Hofmann et al. | |
| 6,987,291 B2 | 1/2006 | Abbott et al. | |
| 7,071,043 B2 * | 7/2006 | Tang et al. | 438/197 |
| 7,118,950 B2 * | 10/2006 | Tang et al. | 438/197 |
| 7,119,384 B2 | 10/2006 | Popp et al. | |
| 7,122,425 B2 * | 10/2006 | Chance et al. | 438/253 |
| 7,153,731 B2 | 12/2006 | Abbott et al. | |
| 7,153,746 B2 | 12/2006 | Moore et al. | |
| 7,157,778 B2 | 1/2007 | Moore | |
| 7,214,621 B2 | 5/2007 | Nejad et al. | |
| 7,244,659 B2 * | 7/2007 | Tang et al. | 438/429 |
| 7,262,089 B2 | 8/2007 | Abbott et al. | |
| 7,282,401 B2 | 10/2007 | Juengling | |
| 7,285,812 B2 | 10/2007 | Tang et al. | |
| 7,349,232 B2 | 3/2008 | Wang et al. | |
| 7,384,849 B2 | 6/2008 | Parekh et al. | |
| 7,432,166 B2 | 10/2008 | Sandhu et al. | |
| 7,459,757 B2 | 12/2008 | Sandhu et al. | |
| 7,465,616 B2 * | 12/2008 | Tang et al. | 438/197 |
| 7,470,576 B2 * | 12/2008 | Tang et al. | 438/197 |
| 7,494,909 B2 * | 2/2009 | Ju et al. | 438/598 |
| 7,659,560 B2 * | 2/2010 | Tang et al. | 257/192 |
| 8,440,515 B2 * | 5/2013 | Tang et al. | 438/197 |
| 2002/0001891 A1 | 1/2002 | Kim et al. | |
| 2002/0098657 A1 | 7/2002 | Alavi et al. | |
| 2003/0008438 A1 | 1/2003 | Abbott et al. | |
| 2003/0015766 A1 | 1/2003 | Abbott et al. | |
| 2004/0033646 A1 * | 2/2004 | Tang et al. | 438/142 |
| 2004/0033668 A1 * | 2/2004 | Cha et al. | 438/300 |
| 2004/0129979 A1 * | 7/2004 | Park et al. | 257/350 |
| 2004/0212024 A1 | 10/2004 | Oh et al. | |
| 2005/0040465 A1 * | 2/2005 | Park et al. | 257/347 |
| 2005/0095756 A1 * | 5/2005 | Tang et al. | 438/151 |
| 2005/0095767 A1 * | 5/2005 | Tang et al. | 438/197 |
| 2005/0101075 A1 * | 5/2005 | Tang et al. | 438/197 |
| 2005/0106795 A1 * | 5/2005 | Tang et al. | 438/197 |
| 2005/0112811 A1 | 5/2005 | Hsu et al. | |
| 2006/0258107 A1 * | 11/2006 | Tang et al. | 438/299 |
| 2007/0105323 A1 * | 5/2007 | Tang et al. | 438/296 |
| 2008/0070356 A1 * | 3/2008 | Brown et al. | 438/197 |
| 2008/0311719 A1 * | 12/2008 | Tang et al. | 438/300 |
| 2009/0140439 A1 * | 6/2009 | Ju et al. | 257/776 |
| 2013/0230959 A1 * | 9/2013 | Tang et al. | 438/295 |

OTHER PUBLICATIONS

Wolf et al., "Silicon Epitaxial Film Growth", Process Technology, vol. 1, Silicon Processing for to VLSI Era, 1986, pp. 1240-160.

* cited by examiner

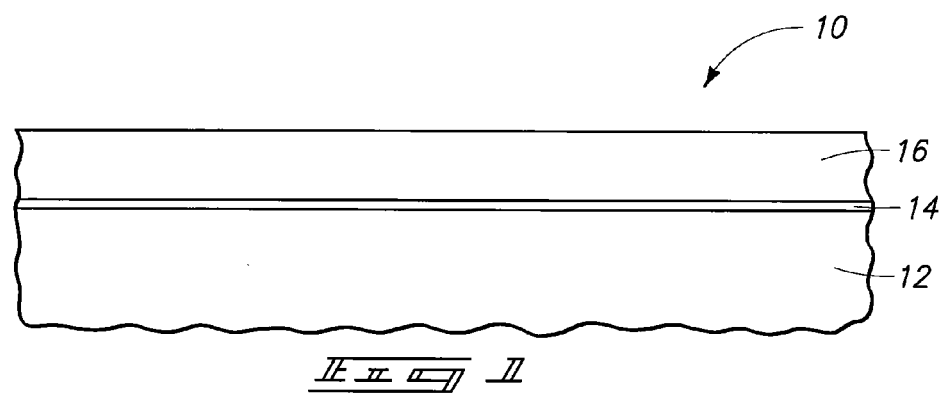
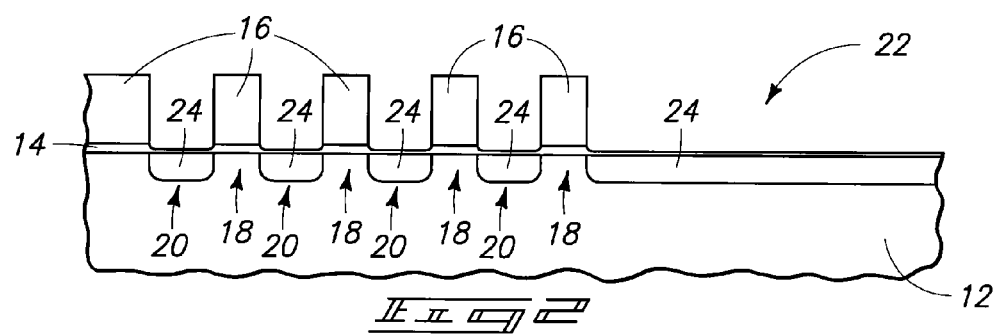
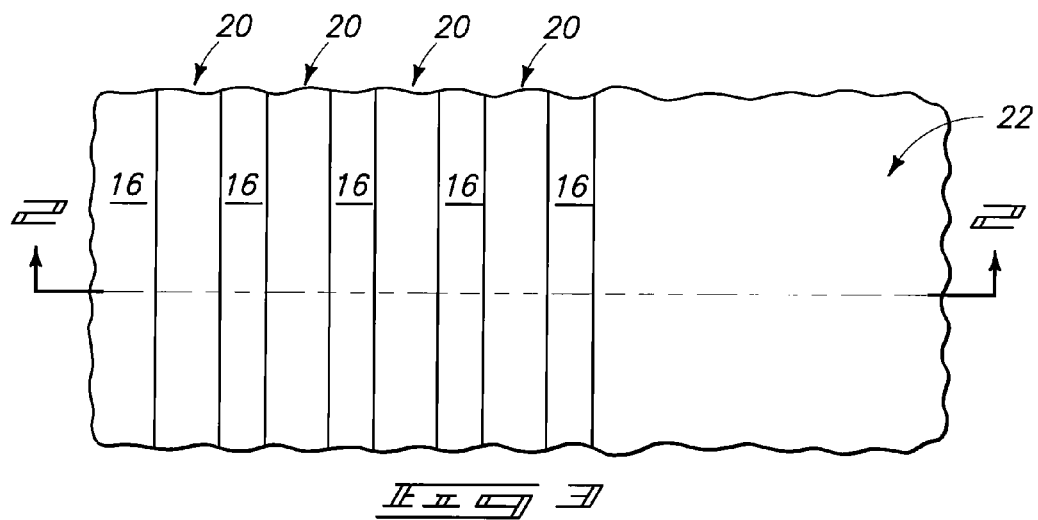

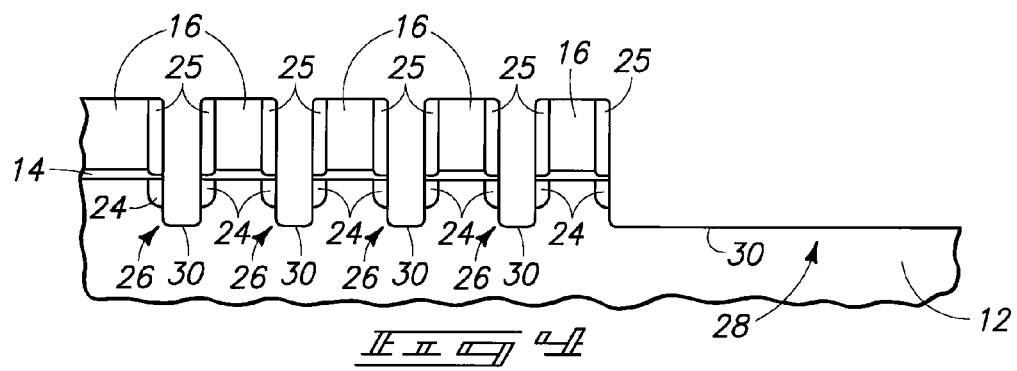
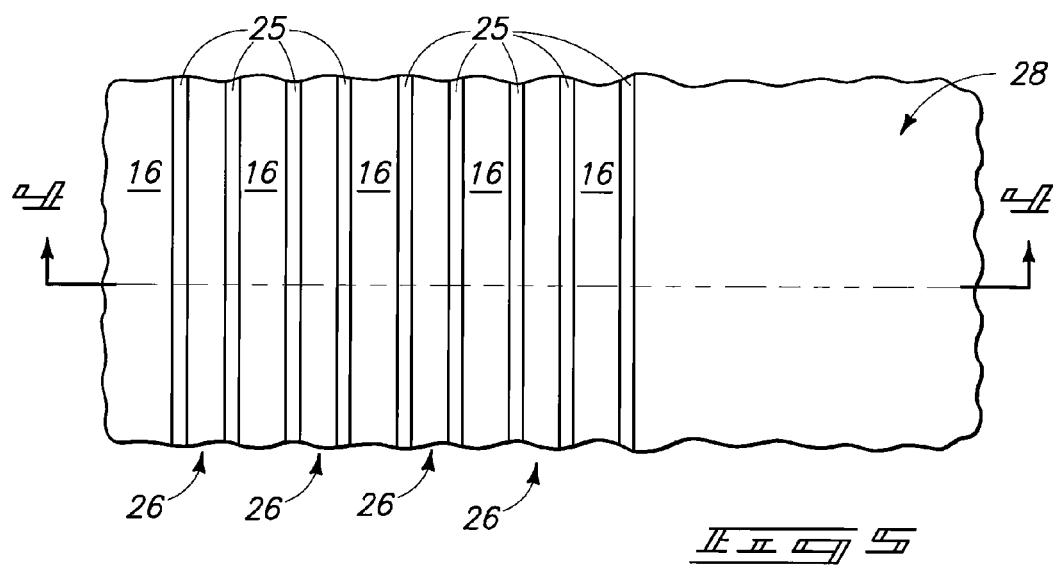
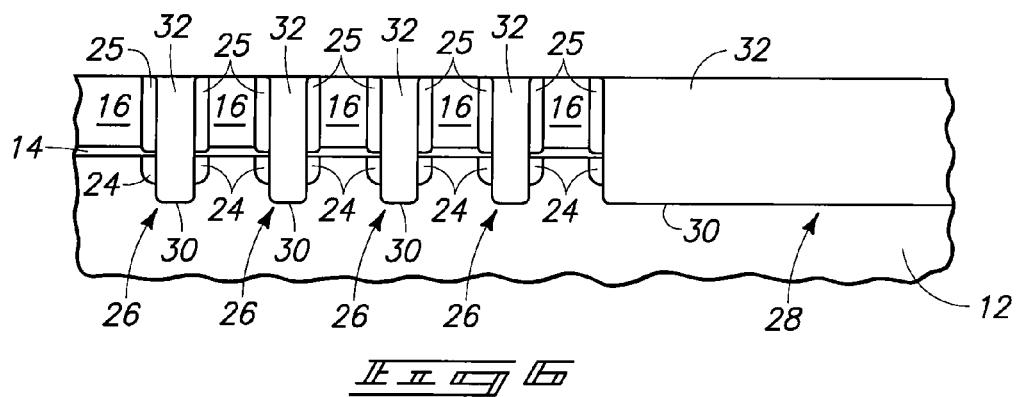

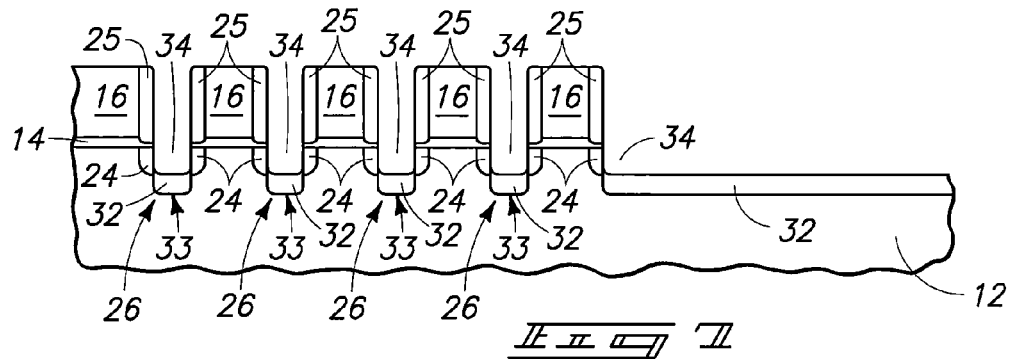
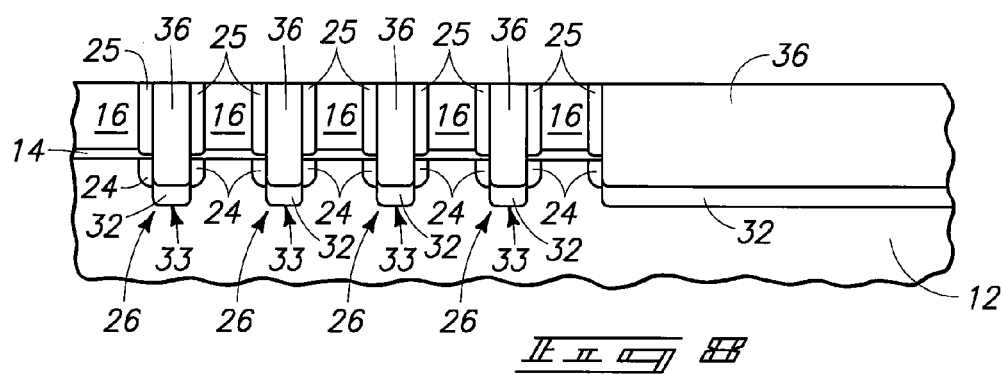
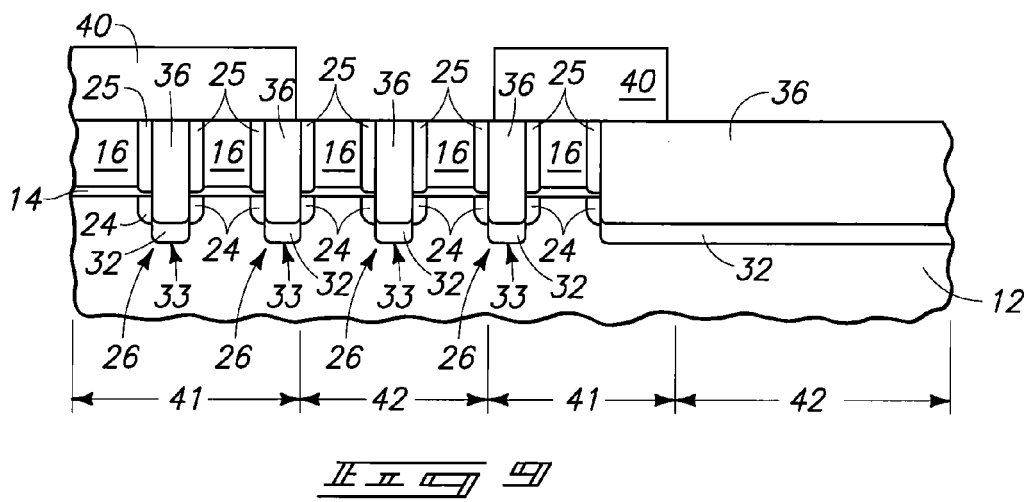

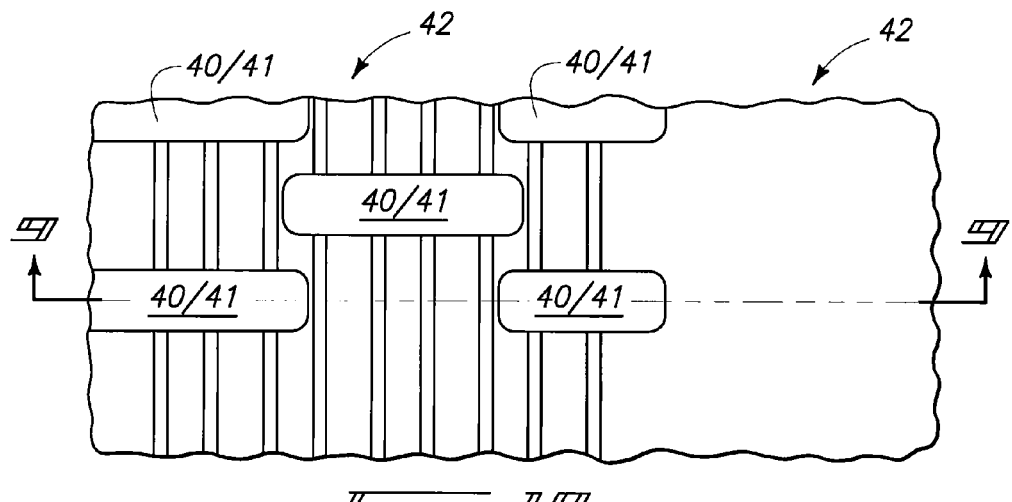
_FIG. 10_
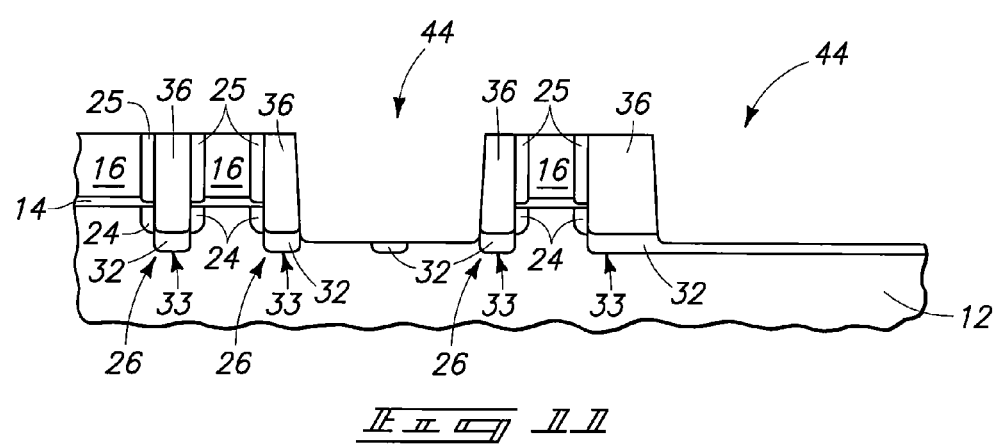
_FIG. 11_
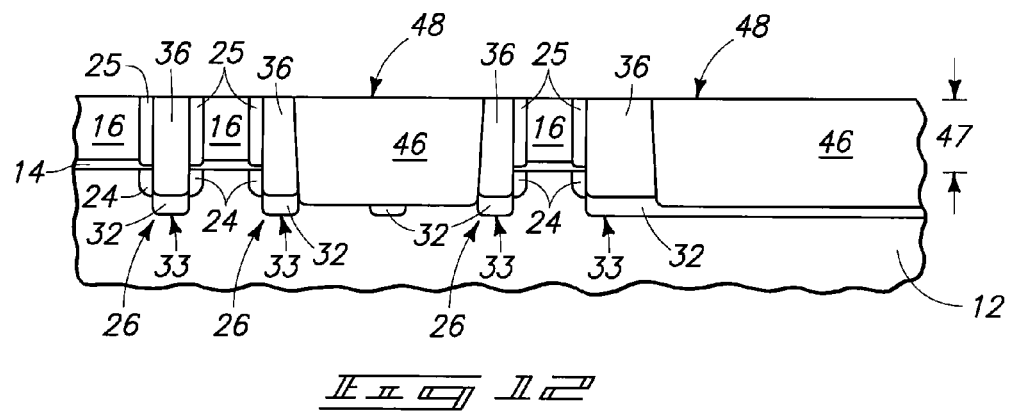
_FIG. 12_

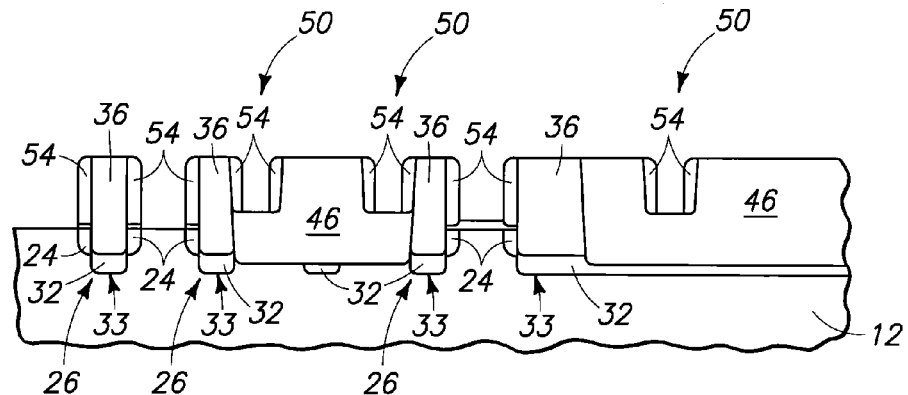
_FIG. 16_
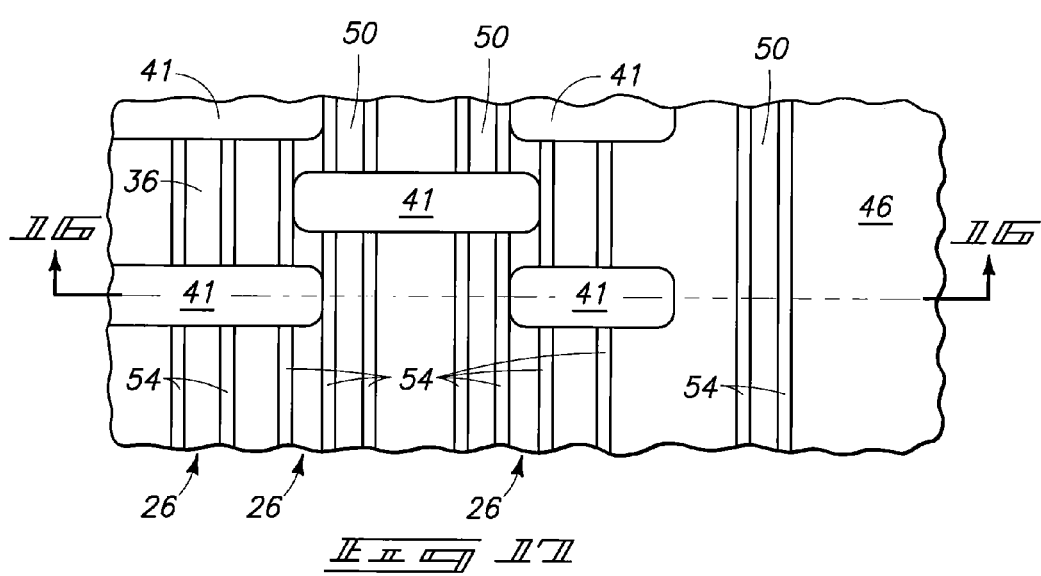
_FIG. 17_
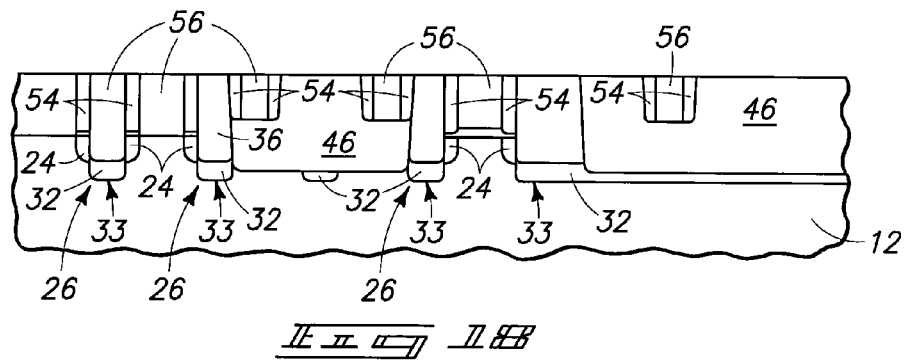
_FIG. 18_

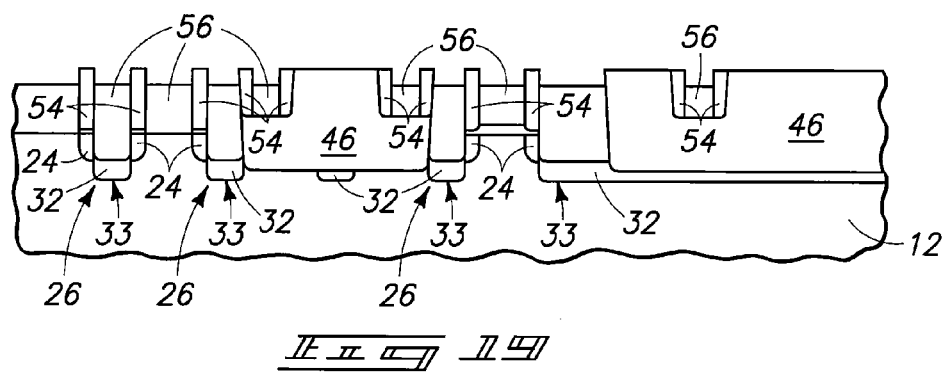
_FIG. 19_
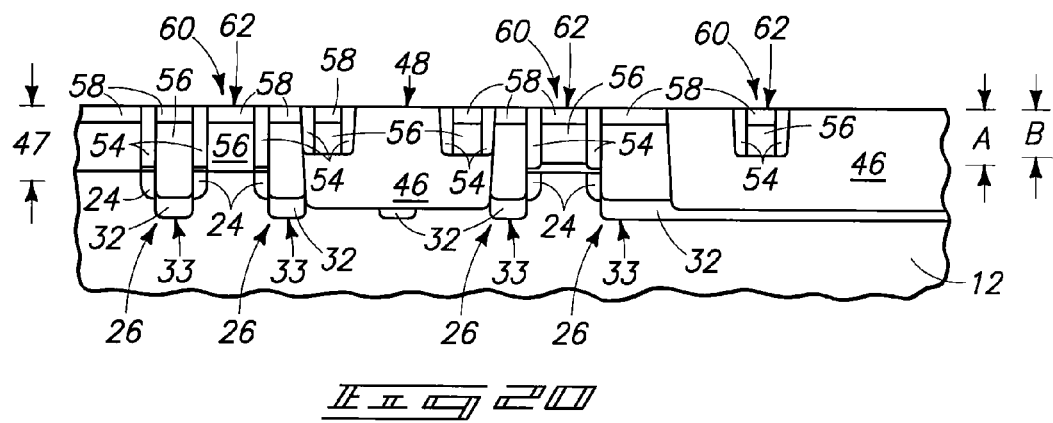
_FIG. 20_

METHOD OF FORMING A FIELD EFFECT TRANSISTOR HAVING SOURCE/DRAIN MATERIAL OVER INSULATIVE MATERIAL

RELATED PATENT DATA

This patent resulted from a continuation of U.S. patent application Ser. No. 12/191,119, filed Aug. 13, 2008, entitled Method of forming a Field Effect Transistor, naming Sanh D. Tang, Michael P. Violette, and Robert Burke as inventors, which resulted from a divisional application of U.S. patent application Ser. No. 11/000,809, filed Nov. 30, 2004, entitled "Method of Forming a Field Effect Transistor", naming Sanh D. Tang, Michael P. Violette and Robert Burke as inventors, now U.S. Pat. No. 7,465,616, which resulted from a divisional application of U.S. patent application Ser. No. 10/222,326, filed Aug. 15, 2002, entitled "Method of Forming a Field Effect Transistor", naming Sanh D. Tang, Michael P. Violette and Robert Burke as inventors, now U.S. Pat. No. 7,071,043, the disclosures of which are incorporated herein by reference.

TECHNICAL FIELD

This invention relates to methods of forming field effect transistors, and to methods of forming field effect transistor gates and gate lines.

BACKGROUND OF THE INVENTION

Semiconductor processors continue to strive to reduce the size of individual electronic components, thereby enabling smaller and denser integrated circuitry. One typical circuitry device is a field effect transistor. Typically, such includes opposing semiconductive source/drain regions of one conductivity type having a semiconductive channel region of opposite conductivity type therebetween. A gate construction is received over the channel region. Such includes a conductive region having a thin dielectric layer positioned between the conductive region and the channel region. Current can be caused to flow between the source/drain regions through the channel region by applying a suitable voltage to the gate.

In some cases, the channel region is composed of a background doped semiconductive substrate, including doped well material thereof, which is also received immediately beneath the opposite type doped source/drain regions. This results in a parasitic capacitance developing between the bulk substrate/well and the source/drain regions. This can adversely affect speed and device operation, and becomes an increasingly adverse factor as device dimensions continue to decrease. Further adverse factors associated with smaller and denser field effect transistor fabrication include source/drain leakage to the substrate, conducting etch stops on very thin gate dielectric layers, and forming contacts with multi-level alignment.

While the invention was motivated in addressing the above issues, it is in no way so limited. The invention is only limited by the accompanying claims as literally worded (without interpretative or other limiting reference to the above background art description, remaining portions of the specification or the drawings) and in accordance with the doctrine of equivalents.

SUMMARY

The invention includes methods of forming field effect transistors and methods of forming field effect transistor gates and gate lines. In one implementation, a method of forming a field effect transistor includes etching an opening into source/drain area of a semiconductor substrate. The opening has a base comprising semiconductive material. After the etching, insulative material is formed within the opening over the semiconductive material base. The insulative material less than completely fills the opening and has a substantially uniform thickness across the opening. Semiconductive source/drain material is formed within the opening over the insulative material within the opening. A transistor gate is provided operatively proximate the semiconductive source/drain material.

In one implementation, a method of forming a field effect transistor having a conductive gate received over a gate dielectric and having lightly doped drain regions formed within semiconductive material includes doping the semiconductive material effective to form the lightly doped drain regions prior to forming any conductive gate material for the transistor gate.

In one implementation, a method of forming a field effect transistor having a conductive gate received over a gate dielectric and having lightly doped drain regions formed within semiconductive material includes doping the semiconductive material effective to form the lightly doped drain regions prior to forming any gate dielectric material for the transistor gate.

In one implementation, a method of forming field effect transistor gate lines over a semiconductor substrate includes forming active area and field isolation trenches within semiconductive material of a semiconductor substrate. Trench isolation material is deposited over the substrate within the trenches. The trench isolation material includes portions that project outwardly of the isolation trenches. A plurality of gate line trenches are etched into at least those portions of the trench isolation material that project outwardly of the isolation trenches. Conductive gate material is formed within the gate line trenches and over the active area.

In one implementation, a method of forming a field effect transistor gate over a semiconductor substrate includes forming an active area and a field isolation trench within semiconductive material of a semiconductor substrate. Trench isolation material is deposited over the substrate within the trench. The trench isolation material includes a portion that projects outwardly of the isolation trench. The portion has an outermost planar surface. A transistor gate construction is formed operably over the active area. The gate construction includes conductive material having an outermost planar surface at least over said active area and which is coplanar with that of the trench isolation material.

In one implementation, a method of forming a field effect transistor having elevated source/drains on a substrate constituting part of a final circuit construction includes forming elevated source/drain material of the transistor prior to depositing an outermost portion of trench isolation material received within an isolation trench and constituting a portion of the final circuit construction.

In one implementation, a method of forming a field effect transistor having elevated source/drains on a substrate includes forming elevated source/drain material of the transistor prior to final patterning which defines outlines of the active area and field isolation.

Other aspects and implementations are contemplated.

BRIEF DESCRIPTION OF THE DRAWINGS

Preferred embodiments of the invention are described below with reference to the following accompanying drawings.

FIG. 1 is a diagrammatic sectional view of a semiconductor wafer fragment in process in accordance with an aspect of the invention.

FIG. 2 is a view of the FIG. 1 wafer fragment at a processing step subsequent to that shown by FIG. 1.

FIG. 3 is a top view of the FIG. 2 wafer fragment.

FIG. 4 is a view of the FIG. 2 wafer fragment at a processing step subsequent to that shown by FIG. 2.

FIG. 5 is a top view of the FIG. 4 wafer fragment.

FIG. 6 is a view of the FIG. 4 wafer fragment at a processing step subsequent to that shown by FIG. 4.

FIG. 7 is a view of the FIG. 6 wafer fragment at a processing step subsequent to that shown by FIG. 6.

FIG. 8 is a view of the FIG. 7 wafer fragment at a processing step subsequent to that shown by FIG. 7.

FIG. 9 is a view of the FIG. 8 wafer fragment at a processing step subsequent to that shown by FIG. 8.

FIG. 10 is a top view of the FIG. 9 wafer fragment.

FIG. 11 is a view of the FIG. 9 wafer fragment at a processing step subsequent to that shown by FIG. 9.

FIG. 12 is a view of the FIG. 11 wafer fragment at a processing step subsequent to that shown by FIG. 11.

FIG. 16 is a view of the FIG. 15 wafer fragment at a processing step subsequent to that shown by FIG. 15.

FIG. 17 is a top view of the FIG. 16 wafer fragment.

FIG. 18 is a view of the FIG. 16 wafer fragment at a processing step subsequent to that shown by FIG. 16.

FIG. 19 is a view of the FIG. 18 wafer fragment at a processing step subsequent to that shown by FIG. 18.

FIG. 20 is a view of the FIG. 19 wafer fragment at a processing step subsequent to that shown by FIG. 19.

DETAILED DESCRIPTION OF THE PREFERRED EMBODIMENTS

Figure 13:
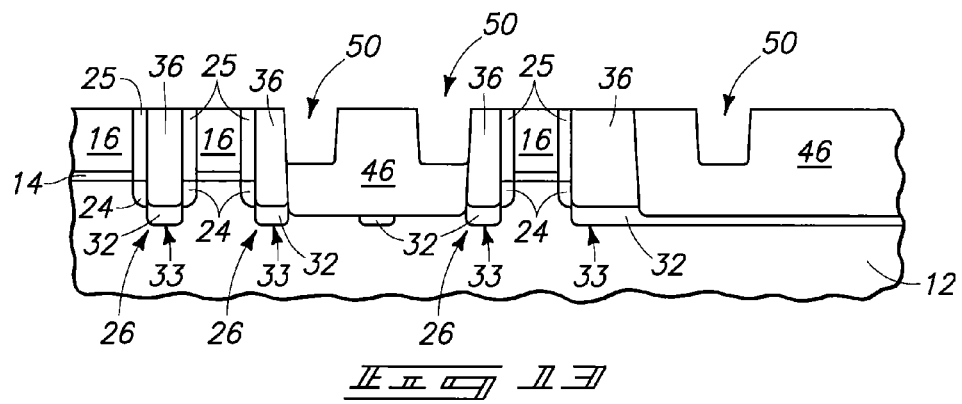
FIG. 13 is a view of the FIG. 12 wafer fragment at a processing step subsequent to that shown by FIG. 12.

This disclosure of the invention is submitted in furtherance of the constitutional purposes of the U.S. Patent Laws "to promote the progress of science and useful arts" (Article 1, Section 8).

Preferred methods of forming field effect transistors are described with reference to FIGS. 1-20. FIG. 1 depicts a semiconductor substrate 10 comprising a bulk monocrystalline silicon substrate 12. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. Also in the context of this document, the term "layer" encompasses both the singular and the plural unless otherwise indicated.

An oxide layer 14, such as silicon dioxide, is formed over bulk silicon substrate 12 to form a pad/protection oxide layer. Such could be formed by any technique, such as thermally oxidizing the outer surface of substrate 12 in a steam ambient at 800° C. to 1100° C. for from one minute to 120 minutes to form a substantially undoped silicon dioxide layer 14 to an exemplary thickness of from 40 Angstroms to 200 Angstroms. Another layer 16 is formed thereover, for instance silicon nitride, by chemical vapor deposition, for example. Collectively, layers 14 and 16 can be considered as a sacrificial masking layer formed as part of semiconductor substrate 10.

Referring to FIGS. 2 and 3, sacrificial masking layer 14/16 has been patterned, preferably to define source/drain areas 20 of substrate 10 and channel areas 18 therebetween. Such also depicts a substrate expanse 22 the majority of which will ultimately constitute field trench isolation, as will become clear in the following description of but one preferred embodiment. Preferred patterning to produce the exemplary FIGS. 2 and 3 construction is by photoresist masking and etch. Layer 16 can be etched substantially selective to underlying oxide layer 14, or completely etched therethrough to the semiconductive material of substrate 12. Lightly doped drain regions 24 are formed within source/drain areas 20 of semiconductive material 12 using patterned sacrificial masking layer 16/14 to mask channel areas 18. Such can of course be formed by implant or other doping methods, for example using phosphorous, arsenic or boron.

Referring to FIGS. 4 and 5, sacrificial anisotropically etched sidewall spacers 25 are formed over the exposed sidewalls of sacrificial masking layer 14/16. Material for spacers 25 might be the same as or different from materials 14 and 16. An exemplary preferred thickness for depositing the layer which produces the anisotropically etched sidewalls is from 100 Angstroms to 200 Angstroms. Thereafter, first trenches or openings 26, 28 are etched into semiconductive material 12 of semiconductor substrate 10, and which includes source/drain area 20. Patterned sacrificial masking layer 14/16 masks channel areas 18 during such etching. Trenches 26, 28 have semiconductive material comprising bases 30 which are received elevationally lower than lightly doped drain regions 24. Any suitable, preferably highly anisotropic, timed etch can be utilized to produce the FIG. 4 depiction. An exemplary depth for trenches/openings 26, 28 relative to an outermost surface of material 12 is from 2,000 Angstroms to 5,000 Angstroms. Preferred openings/trenches 26, 28 are in the form of channels spanning source/drain areas of a plurality of field effect transistors being formed, such as shown in FIG. 5.

Referring to FIG. 6, insulative material 32 is formed within first trenches 26, 28 over bases 30, and preferably on bases 30 as shown. An exemplary and preferred material is high density plasma deposited silicon dioxide from the decomposition of tetraethylorthosilicate (TEOS). By way of example only, alternate materials such as silicon nitride are also of course contemplated. Typically, such provision of insulative material 32 will, at least initially, overfill (not shown) first trenches 26, 28. In the depicted example, such material 32 has been planarized back, preferably by CMP, to selectively stop on the outer surface of sacrificial masking layer 14/16.

Referring to FIG. 7, insulative material 32 has been etched back to leave lower portions 33 of first trenches 26, 28 filled with insulative material 32 while leaving outer portions 34 of trenches 26, 28 open. Portions 33 of trenches 26, 28, and accordingly, insulative material 32 received therein, preferably have a thickness of less than 1000 Angstroms, and more preferably less than 600 Angstroms. An exemplary preferred thickness range is from 300 Angstroms to 600 Angstroms for the material 32 remaining in trenches 26, 28 in FIG. 7. Further in the FIG. 7 illustrated preferred embodiment, such insulative material has a substantially uniform thickness across the openings. Such provides but one exemplary method of forming insulative material within openings 26, 28 to less than completely fill such openings, here for example by depositing insulative material and etching it back. Further in accordance with a preferred aspect and as described, such etching of insulative material 32 occurs in a blanket manner, without using any photoresist masking during the etching.

The exposed semiconductive material surfaces in FIG. 7 are preferably wet cleaned, for example with HF, to remove any remaining oxide and repair any damage to such surfaces.

Referring to FIG. 8, semiconductive elevated source/drain material 36 is formed within upper portions 34 of first openings/trenches 26, 28 over, and on as shown, insulative material 32 received within such openings. An exemplary preferred material 36 is conductively doped polysilicon, for example deposited by chemical vapor deposition. Typically, such would be deposited to overfill the illustrated FIG. 7 openings, and subsequently planarized back by an exemplary polishing or etch back method. In such preferred embodiment, this leaves elevated source/drain material projecting outwardly of first trenches 26, 28 relative to semiconductive material 12.

Referring to FIGS. 9 and 10, a photoresist comprising layer 40 has been deposited and patterned to mask desired active area 41 and expose desired trench isolation area 42. Photoresist comprising masking layer 40 is shown as being formed over sacrificial masking layer 14/16, spacers 25 and elevated source/drain material 36.

Referring to FIG. 11, exposed portions of sacrificial masking layer 14/16, sacrificial spacers 25, elevated source/drain material 36 and semiconductive material 12 of substrate 10 have been etched effective to form isolation trenches 44 within substrate semiconductive material 12 using photoresist comprising masking layer 40, and then such has been removed. The above-described processing provides but one exemplary method of forming active area and field isolation trenches within semiconductive material of a semiconductive substrate. Any suitable etching chemistries, preferably anisotropic chemistries and methods, can be employed to remove the various materials.

Referring to FIG. 12, trenches 44 have been filled with insulative isolation material 46. Such might be the same or different in composition as material 32 therebeneath. Typically and preferably, such formation will be by a deposition which overfills the isolation trenches, followed by a planarizing or polishing etch back to produce the illustrated FIG. 12 construction. Preferably as shown, such will produce isolation material 46 to include portions 47 that project outwardly of isolation trenches 26, 28. Further preferably as shown, projecting portions 47 include outermost planar surfaces 48.

Figure 14:
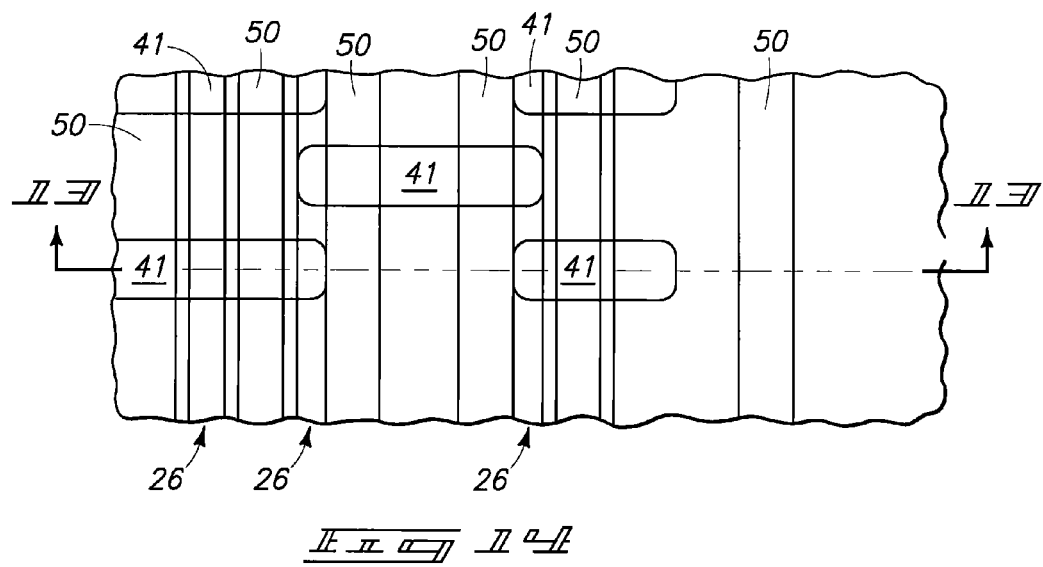
FIG. 14 is a top view of the FIG. 13 wafer fragment.

Referring to FIGS. 13 and 14, a plurality of gate line trenches 50 are etched into outermost planer surfaces 48 into at least those portions 47 of trench isolation material 46 that project outwardly of isolation trenches 44. Preferably, such is conducted by photoresist masking and any suitable anisotropic, timed etch. Trenches 50 are also preferably configured to align relative to sacrificial masking layer 14, 16 for the ultimate formation of transistor gate lines, as will be apparent from the continuing discussion.

Figure 15:
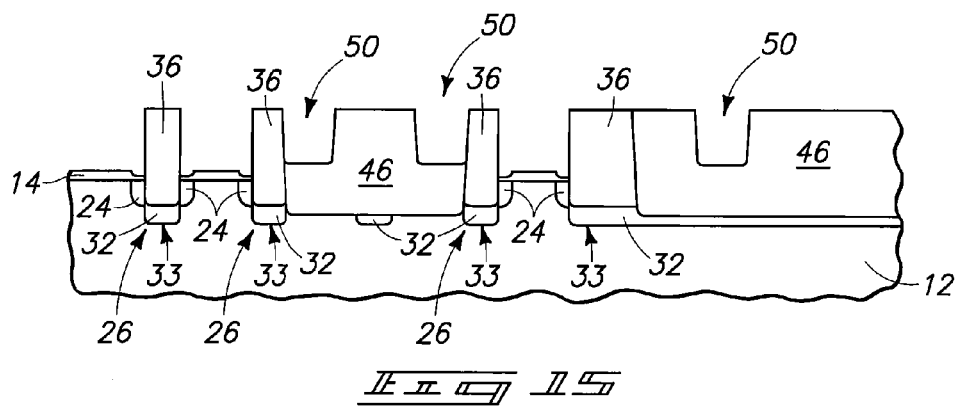
FIG. 15 is a view of the FIG. 13 wafer fragment at a processing step subsequent to that shown by FIG. 13.

Referring to FIG. 15, all remaining portions of sacrificial masking layer 14, 16 have been removed from the substrate, preferably by any suitable etching process or processes.

Referring to FIGS. 16 and 17, anisotropically etched insulative spacers 54 are formed within gate line trenches 50. Exemplary materials include silicon dioxide and silicon nitride. Optimum spacer thickness can be selected based upon anticipated gate induced drain leakage in comparison with desired minimum conductive gate material width.

Referring to FIG. 18, a first material 56 of a first conductivity has been deposited within gate line trenches 50. An exemplary material is conductively doped polysilicon deposited by CVD, and planarized back by CMP. If complementary p-type and n-type transistors are being fabricated, n+ gate, n+ source/drain, p+ gate and p+ source/drain doping would preferably occur to the FIG. 18 construction. Any desired well implants might be conducted at this point, also, prior to or after the depicted FIG. 18 processing.

Referring to FIG. 19, first material 56 has been partially blanketly etched back within gate line trenches 50. Masked etching of only some of first material 56 could also of course occur, or no etching of any first material 56.

Referring to FIG. 20, a second material 58 of a second conductivity greater than the first conductivity has been formed onto first material 56 within gate line trenches 50. Exemplary preferred materials include refractory metal silicides, such as tungsten silicide, cobalt silicide and nickel silicide. Such could occur by direct CVD of the same, or refractory metal deposition followed by salicidation anneal. Thus in the depicted and described preferred embodiment, conductive portions of the gates are formed from materials 56/58.

Preferably as shown, such forms gates 60 within gate line trenches 50 which have outermost planar conductive surfaces 62 which are coplanar with outermost planar surfaces 48 of projecting portions 47 of insulative isolation material 46. Such also forms the conductive material of gates 60 to have a thickness "A" over immediately underlying material which is greater over active area 41 than a thickness "B" over trench isolation material 46.

Such provides but one example of providing a transistor gate operatively proximate conductive source/drain material 36, and as shown between such material for individual transistors. Such also provides an example where the source/drain material forms preferred elevated source/drains of the field effect transistors being fabricated. Such also provides but one example of forming a transistor gate construction operably over the active area for the field effect transistor, with the gate construction comprising conductive material having an outermost planar surface at least over the active area which is coplanar with that of the trench isolation material.

In accordance with but one aspect of the invention, the above processing describes but one exemplary method of forming a field effect transistor having a conductive gate received over a gate dielectric and having lightly doped drain regions formed within semiconductive material. Such method includes doping the semiconductive material effective to form the lightly doped drain regions prior to forming any conductive gate material for the transistor gate being formed. Of course, any of the above or subsequently-described processing can be conducted relative to both bulk semiconductive material or relative to other semiconductor constructions, for example semiconductor-on-insulator circuitry, as well as any other circuitry, whether existing or yet-to-be developed. Further, unless literally precluded by specific claim language for a claim under analysis, various aspects of the above and below described processing can be conducted with any sort of field isolation, and not limited necessarily to trench field isolation.

In accordance with one preferred aspect of the invention, at least some of the field isolation material is formed after doping to form the lightly doped drain regions, for example the material 46 described above. Further preferably, source/drain material is provided in contact with insulating material thereunder after doping to form the lightly doped drain regions, preferably by depositing such source/drain material. However, the formation of insulative material by other techniques, for example ion implantation, is contemplated also, unless otherwise precluded from claim language of a claim under analysis.

In another considered aspect, the invention constitutes a method of forming a field effect transistor having a conductive gate received over a gate dielectric and having lightly doped drain regions formed within semiconductive material, where the method includes doping the semiconductive material effective to form the lightly doped drain regions prior to forming any gate dielectric material for the transistor gate.

Further in but one aspect of the invention, the invention contemplates a method of forming a field effect transistor having elevated source/drains on a substrate constituting part of a final circuit construction. Such a method includes forming elevated source/drain material of the transistor prior to depositing an outermost portion of trench isolation material received within an isolation trench and constituting a portion of the final circuit construction. By way of example only, an exemplary outermost portion of trench isolation material includes material 46, as initially described in FIG. 12. Further preferably, the trench isolation material is formed by at least two time spaced depositings, for example the depositings to form materials 32 and 46. Further preferably in such method, a later-in-time of the depositings comprises the forming of the outermost portion (i.e., material 46), while an earlier-in-time of the depositings occurs prior to forming the elevated source/drain material (i.e., formation of material/portions 33).

Further by way of example only, the invention contemplates a method of forming a field effect transistor having elevated source/drains on a substrate, which includes forming elevated source/drain material of the transistor prior to the final patterning that defines outlines of the active area and field isolation. By way of example only, such final patterning is depicted in FIGS. 9 and 10 of the above preferred described embodiment. Further preferably, the field isolation is formed to comprise trench isolation, and the elevated source/drain material is formed within openings in the semiconductive material of a semiconductor substrate. Further and in accordance with this aspect, a preferred method includes forming insulative material within the semiconductive material openings prior to forming the elevated source/drain material within the semiconductive material openings.

Further in another preferred aspect with respect to the above, the elevated source/drain material is formed within the openings in the bulk semiconductive material of a bulk semiconductor substrate, as described in connection with the preferred embodiment.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of forming a field effect transistor having laterally spaced elevated source/drains on a substrate comprising forming and laterally spacing elevated source/drain material of the transistor prior to final patterning which defines the lateral peripheral outline of active area where such physically contacts field isolation and which defines the lateral peripheral outline of the field isolation where such physically contacts the active area.

2. The method of claim 1 comprising forming the field isolation to comprise trench isolation.

3. The method of claim 1 wherein the forming and laterally spacing of elevated source/drain material comprises depositing elevated source/drain material within openings formed in bulk monocrystalline semiconductive material.

4. The method of claim 3 comprising forming insulative material within the bulk monocrystalline semiconductive material openings prior to forming the elevated source/drain material within the bulk monocrystalline semiconductive material openings.

5. The method of claim 1 comprising planarizing the laterally spaced elevated source/drain material prior to the final patterning.

6. The method of claim 2 comprising forming the trench isolation material by at least two time spaced depositings.

7. The method of claim 1 comprising forming the laterally spaced elevated source/drain material against previously formed anisotropically etched spacers.

8. The method of claim 7 comprising removing the anisotropically etched spacers after forming the laterally spaced elevated source/drain material.

9. The method of claim 8 comprising removing the anisotropically etched spacers after the final patterning.

10. The method of claim 1 comprising after forming the laterally spaced elevated source/drain material, forming electrically insulative anisotropically etched spacers against sidewalls of the laterally spaced elevated source/drain material.

11. The method of claim 10 comprising after the final patterning, forming the electrically insulative anisotropically etched spacers against sidewalls of the laterally spaced elevated source/drain material.

12. The method of claim 1 comprising:
    forming the laterally spaced elevated source/drain material against previously formed first anisotropically etched spacers;
    removing the first anisotropically etched spacers after forming the laterally spaced elevated source/drain material; and
    after removing the first anisotropically etched spacers, forming electrically insulative second anisotropically etched spacers against sidewalls of the laterally spaced elevated source/drain material.

13. The method of claim 1 comprising forming conductive material of a gate of the transistor after forming the laterally spaced elevated source/drain material.

14. The method of claim 1 comprising forming gate dielectric material of a gate of the transistor after forming the laterally spaced elevated source/drain material.

15. The method of claim 1 comprising forming gate dielectric material and conductive material of a gate of the transistor after forming the laterally spaced elevated source/drain material.

16. The method of claim 15 comprising forming LDD regions of the transistor prior to forming the gate dielectric material and the conductive material of a gate.

17. The method of claim 1 comprising forming LDD regions of the transistor prior to forming the laterally spaced elevated source/drain material.

18. The method of claim 1 comprising forming electrically insulative material upon which the laterally spaced elevated source/drain material is formed.

19. The method of claim 1 comprising forming the laterally spaced elevated source/drain material to comprise polysilicon.

20. The method of claim 19 wherein forming the laterally spaced elevated source/drain material comprises deposition of polysilicon followed by polishing an outermost surface thereof.

21. The method of claim 13 comprising forming the conductive material of the gate and the elevated source/drain regions to have planar elevationally outermost surfaces.

22. The method of claim 21 wherein the planar elevationally outermost surfaces of the gate and the elevated source/drain regions are coplanar.

23. The method of claim 22 comprising etching the conductive material of the gate and the elevated source/drain regions elevationally inward, and thereafter forming a conductor material onto each of the conductive material and elevated source/drains, the conductor material being of higher conductivity than the conductive material and the elevated source/drains.

24. A method of forming a field effect transistor having laterally spaced elevated source/drains on a substrate comprising forming and laterally spacing elevated source/drain material of the transistor prior to final patterning which defines the lateral peripheral outline of active area where such physically contacts field isolation and which defines the lateral peripheral outline of the field isolation where such physically contacts the active area, the final patterning comprising etching into the laterally spaced elevated source/drain material.

25. The method of claim 24 wherein the final patterning comprises etching completely through the laterally spaced elevated source/drain material.

* * * * *